United States Patent
Brown (10) Patent No.: US 6,693,823 B2
(45) Date of Patent: Feb. 17, 2004

(54) MINIMIZATION OF METAL MIGRATION IN MAGNETIC RANDOM ACCESS MEMORY

(75) Inventor: Michael A. Brown, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 18 days.

(21) Appl. No.: 10/037,843

(22) Filed: Jan. 2, 2002

(65) Prior Publication Data

US 2003/0123280 A1 Jul. 3, 2003

(51) Int. Cl.$^7$ .............................................. G11C 11/00
(52) U.S. Cl. ........................ 365/158; 365/171; 365/173; 365/210
(58) Field of Search ................................ 365/158, 171, 365/173, 210

(56) References Cited

U.S. PATENT DOCUMENTS

| | | | | |
|---|---|---|---|---|
| 5,699,293 A | * | 12/1997 | Tehrani et al. | 365/158 |
| 5,793,697 A | * | 8/1998 | Scheuerlein | 365/230.07 |
| 6,215,707 B1 | * | 4/2001 | Moyer | 365/189.07 |
| 6,504,752 B2 | * | 1/2003 | Ito | 365/158 |

* cited by examiner

*Primary Examiner*—Son T. Dinh
(74) *Attorney, Agent, or Firm*—Blakely, Sokoloff, Taylor & Zafman LLP (57) ABSTRACT

A method for mitigating metal migration in magnetic cell structures. The method includes directing flow of currents to provide substantially consistent and statistically symmetrical current flow in the conductors of the magnetic cell structures.

27 Claims, 8 Drawing Sheets

MINIMIZATION OF METAL MIGRATION IN MAGNETIC RANDOM ACCESS MEMORY

BACKGROUND

The present invention relates to magnetic random access memory (MRAM). More particularly, the invention relates to minimizing metal migration in the MRAM.

Magnetic random access memory (MRAM) utilizes magnetic fields created by the flow of electrons to sense and change the state of magnetic material. The magnetic field strengths generated by these currents must be sufficient to change the robust, stable magnetic state of the material. However, high current density introduces electron flow that pushes around metal grains to cause increased metal migration in conductors, which carry currents necessary to perform the work function on magnetic material. Hence, this requirement introduces a tradeoff between the current density capabilities of the conductors and the stiffness of the magnetic material. These contradictory requirements may force the designer to push the currents to the maximum values allowed under the metal migration constraints of the conductors.

Accordingly, based on Nickel-Cobalt-Iron (NiCoFe) magnetic material, the current required may be in the milliampere (mA) range. But the capability of the bit-line and word-line to carry this much current for sustained periods may not be feasible for this type of magnetic memory application. Although current requirements may change with the selection of alternative magnetic material and/or the modification to the magnetic structures, such selection/modification may not be sufficient to substantially eliminate metal migration concern. One conventional approach to metal migration concern has been to minimize the time that the current is flowing. However, this may not be practical in memory technologies where increased performance and density are expected.

DETAILED DESCRIPTION

In recognition of the above-described requirements placed on current density of existing conductors in view of the metal migration constraints, the present invention describes embodiments for mitigating the migration of metal in the magnetic cells. In particular, the present embodiments provide mitigation of the metal migration by ensuring substantially consistent and statistically symmetrical current flow in the conductors, such as word-lines and bit-lines. Therefore, minimizing the metal migration may enhance the reliability and extend the scalability of the cells utilized in magnetic random access memory (MRAM). Consequently, for purposes of illustration and not for purposes of limitation, the exemplary embodiments of the invention are described in a manner consistent with such use, though clearly the invention is not so limited.

The structure of the magnetic cells in MRAM present configuration challenges to sense and change the state of the cells. Furthermore, there are current density concerns involving the thin copper bit-lines and the narrow word-lines. The relationship among the bit-lines, word-lines and the cylindrical magnetic cell structures from the perspective of the conductors around those cells is described below in conjunction with FIGS. 1A through 1D.

As shown in FIGS. 1A through 1D, there are two currents that affect the magnetic state of a cell 100, 102 in MRAM. The first is the bit-line current 110, 112 orthogonal to the layers 104, 105, 106, 107 of the cell 100, 102. This current 110, 112 travels vertically through the cell 100, 102, and is used to sense and change the magnetic state of the cell 100, 102. The magnetic layers 104–107 in the cell 100, 102 include thick (i.e. strong field) magnetic layers 105, 107 and thin (i.e. weak field) magnetic layers 104, 106.

When the magnetic layers 104–107 are magnetically misaligned (i.e. the thin 104, 106 and thick 105, 107 layers are aligned in opposite directions), as shown in the cell 100 (FIG. 1A), the cell 100 is in a high magneto-resistive or high-impedance state. However, when the magnetic layers 104–107 are magnetically aligned (i.e. the thin 104, 106 and thick 105, 107 layers are aligned in same direction), as shown in the cell 102 (FIG. 1A), the cell 102 is in a low magneto-resistive or low-impedance state. The magnetic state of the thick layer 105, 107 holds the current logical value, logic one or zero. Hence, the orientation of the thick magnetic layers 105, 107, clockwise (as in 100) or counter-clockwise (as in 102), may be arbitrarily assigned to logic one state.

Figure 1A:
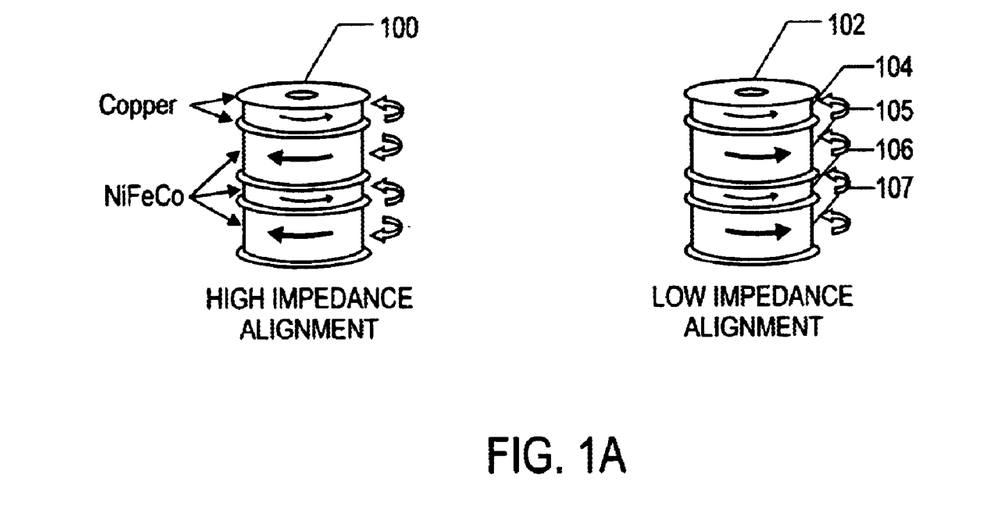
FIGS. 1A through 1D illustrate magnetic cells of the magnetic random access memory (MRAM) and related currents and fields.
Figure 1B:
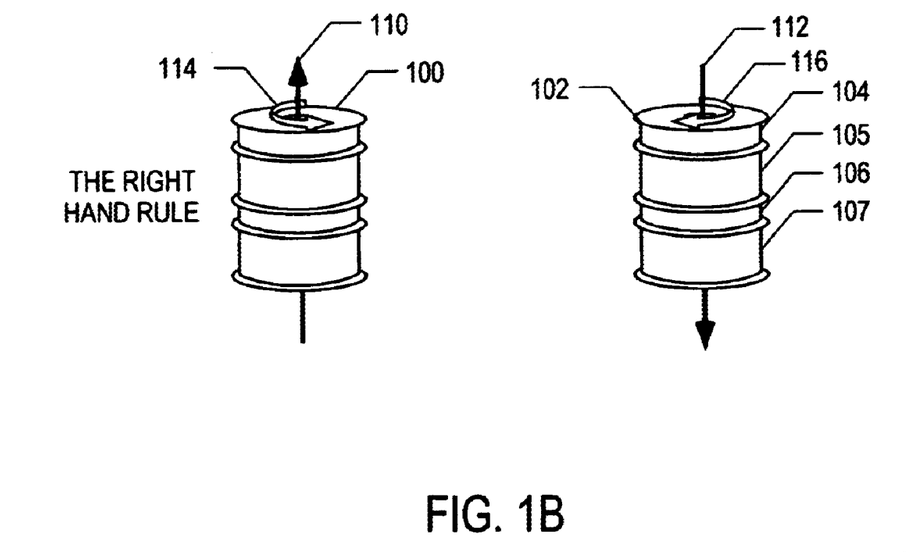

As illustrated in FIG. 1B, when a bit-line current 110, 112 flows vertically through a magnetic cell structure 100, 102, a magnetic field 114, 116 is generated in the cell 100, 102 according to the right-hand rule. Thus, when the current flow 110 is in a vertically upward direction, a counter-clockwise magnetic field 114 is generated. Moreover, when the current flow 112 is in a vertically downward direction, a clockwise magnetic field 116 is generated.

Figure 1C:
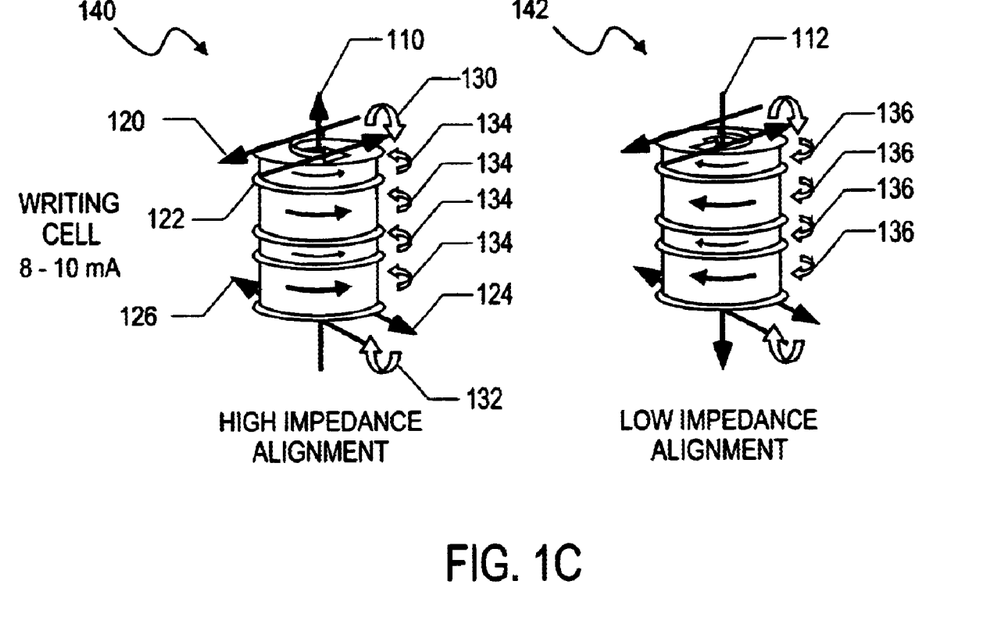

Further, as illustrated in FIG. 1C, when a current flows in a word-line 120, 122, 124, 126, a magnetic field 130, 132 encircles the conductor and imposes a magnetic vector that is orthogonal to the magnetic field 114, 116, 134, 136 within the cell. Accordingly, the interactions of the fields 114, 116, 130, 132, 134, 136 created by the currents 110, 112, 120, 122, 124, 126 flowing in the bit-line and word-lines are used to set and sense the magnetic state of the cell. The magnitudes of these currents are proportional to the magnetic moments of the material. Therefore, maximizing the magnetic moments may be necessary to provide a stable and robust memory device.

Figure 1D:
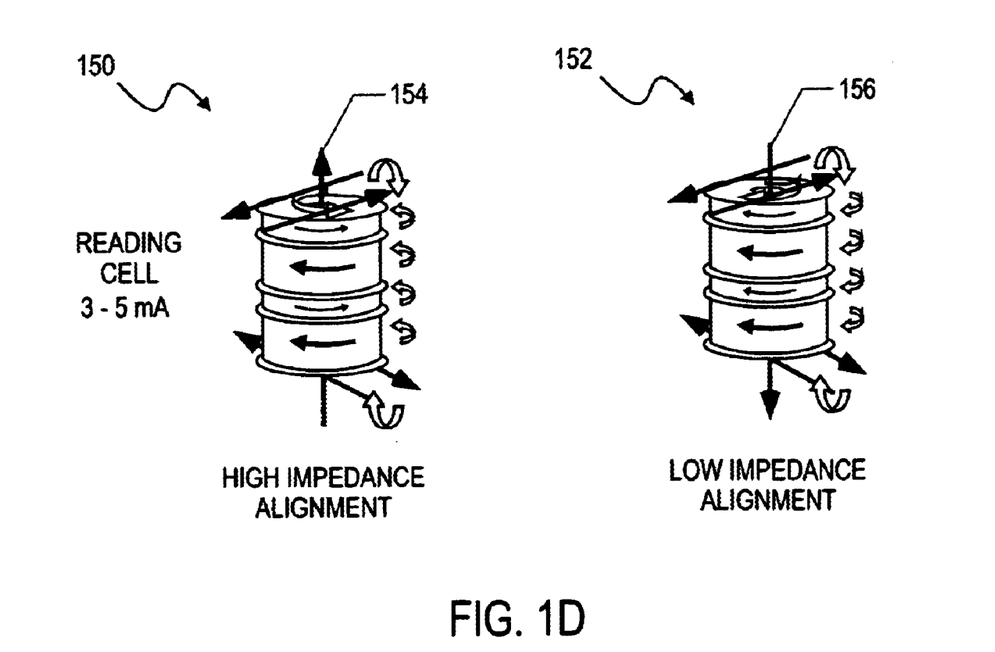

In particular, the bit-line currents 110, 112 flowing in the cell structures 140, 142 of FIG. 1C are larger than the bit-line currents 154, 156 flowing in the cell structures 150, 152 of FIG. 1D. The larger bit-line currents 110, 112 are used to change the state of the thick magnetic layers 105, 107 of the cells 140, 142 in the write mode. The smaller currents 154, 156 are used to change the state of the thin magnetic layers 104, 106 of the cells 150, 152 in the read or sense mode. In one embodiment, the larger bit-line currents 110, 112 used to change/write the state of the cells 140, 142 are in a range between about 8 and 10 mA. In another embodiment, the smaller bit-line currents 154, 156 used to sense/read the state of the cells 150, 152 are in a range between about 3 to 5 mA.

Figure 2A:
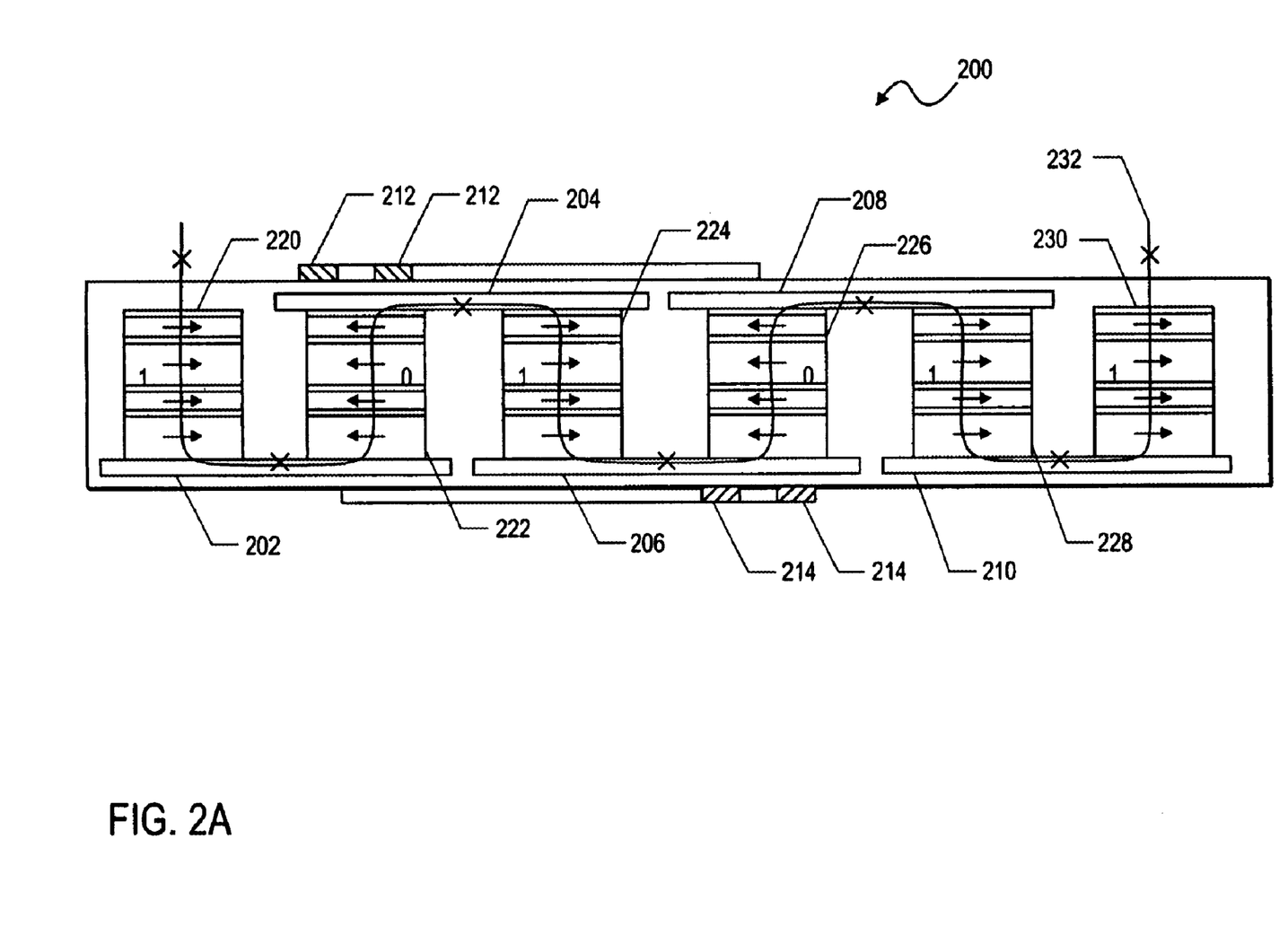
FIGS. 2A and 2B show the side and top views, respectively, of the array of magnetic cells, and the bit-line and word-line current flow paths in accordance with an embodiment of the present invention.
Figure 2B:
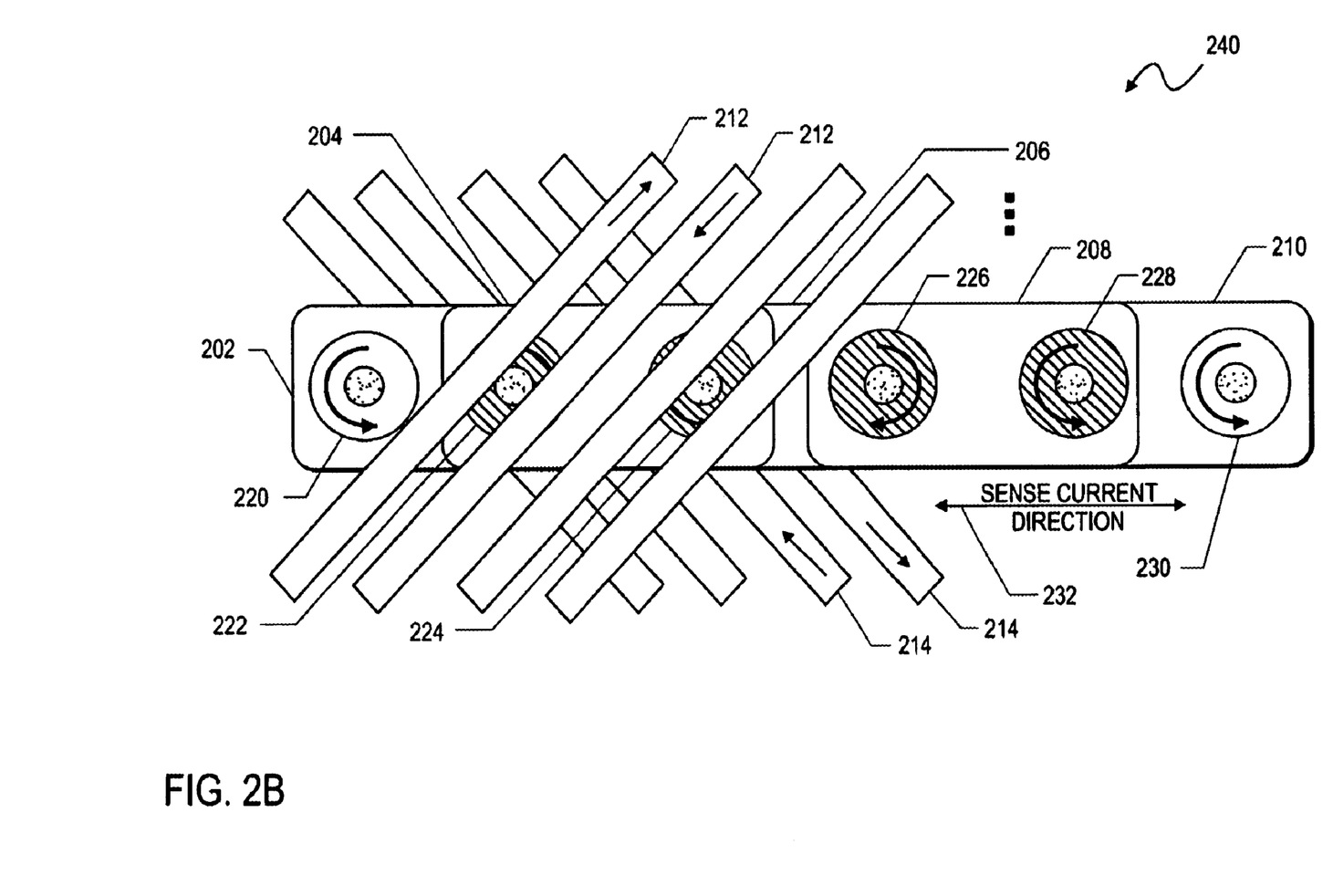

FIGS. 2A and 2B show the side 200 and top 240 views, respectively, of the array of magnetic cells 220–230, and the bit-line 232 and word-line 212, 214 current flow paths. The side view 200 of the bit-line 232 (see FIG. 2A) shows the direction of the sense current flow. The bit-line carrying the sense current includes a series of vertically meandering lower and upper bit-line segments 202, 204, 206, 208, 210. The sense current interweaves and serpentines through the magnetic cells 220–230 connected by the bit-line segments 202–210. Thus, the current alternates its vertical travel through the adjacent cells.

The top view 240 (see FIG. 2B) shows at least two pairs of word-lines (one pair on the top 212 and one pair on the bottom 214) assigned to each magnetic cell 220–230. The current flow in each pair 212, 214 are opposite in direction. Moreover, the word-lines are generally arranged diagonally to the parallel array of bit-lines.

In one embodiment, the bit-lines are made thin by standard silicon process to allow the magnetic field from the word-lines to penetrate the magnetic cell. Hence, the bit-lines may typically be less than 0.1 $\mu$m thick, and 2 to 3 time the width of the minimum feature size ($\lambda$). Furthermore, the word-lines are made as narrow as possible to exploit the maximum cell density potential. The current in the bit-lines in conjunction with the current in the word-lines are used to sense and change the current state of the memory cells. In an alternative embodiment, the word-lines may be made thick, but not so thick that the magnetic field lines are inhibited from fully entering the magnetic cells.

As stated above, the present embodiments provide mitigation of metal migration in magnetic cell structures. In one embodiment, the conductors of the magnetic cell structures are configured to provide appropriate magnetic fields for writing data to and sensing data from the magnetic cell structures. Moreover, the flow of currents in the conductors of the magnetic cell structures is directed to provide substantially consistent and statistically symmetrical current flow in the conductors.

Figure 3:
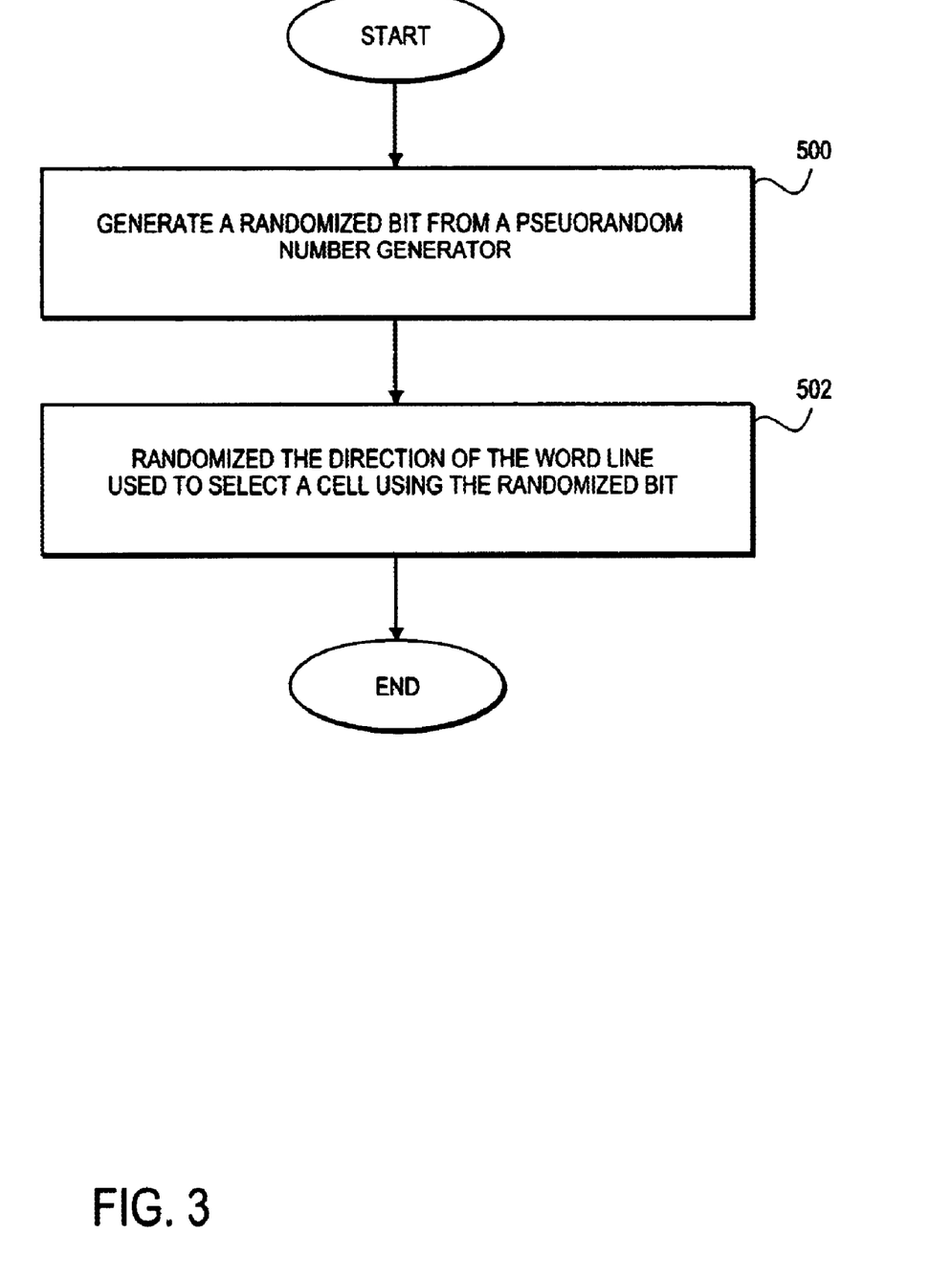
FIG. 3 illustrates a method for mitigating metal migration in the bit-line of the magnetic cell during a write mode according to an embodiment of the present invention.

FIG. 3 illustrates a method for mitigating metal migration in the bit-line during a write mode in accordance with an embodiment of the present invention. To mitigate the metal migration, the bit-line current is initially propagated in a direction opposite to the desired magnetic state of the cell, at 300. The direction of the bit-line current is then reversed (at 302) to set the desired state of the cell to an appropriate value. Although this action may impact the system performance of the memory, the impact may be reduced by applying a larger current in the reverse direction for an inversely proportional time relative to the current ratio. In some embodiments, the duration of the current necessary to change the state of the cell is less than 800 pico-seconds. In other embodiments, the duration may be less than 400 pico-seconds.

Figure 4:
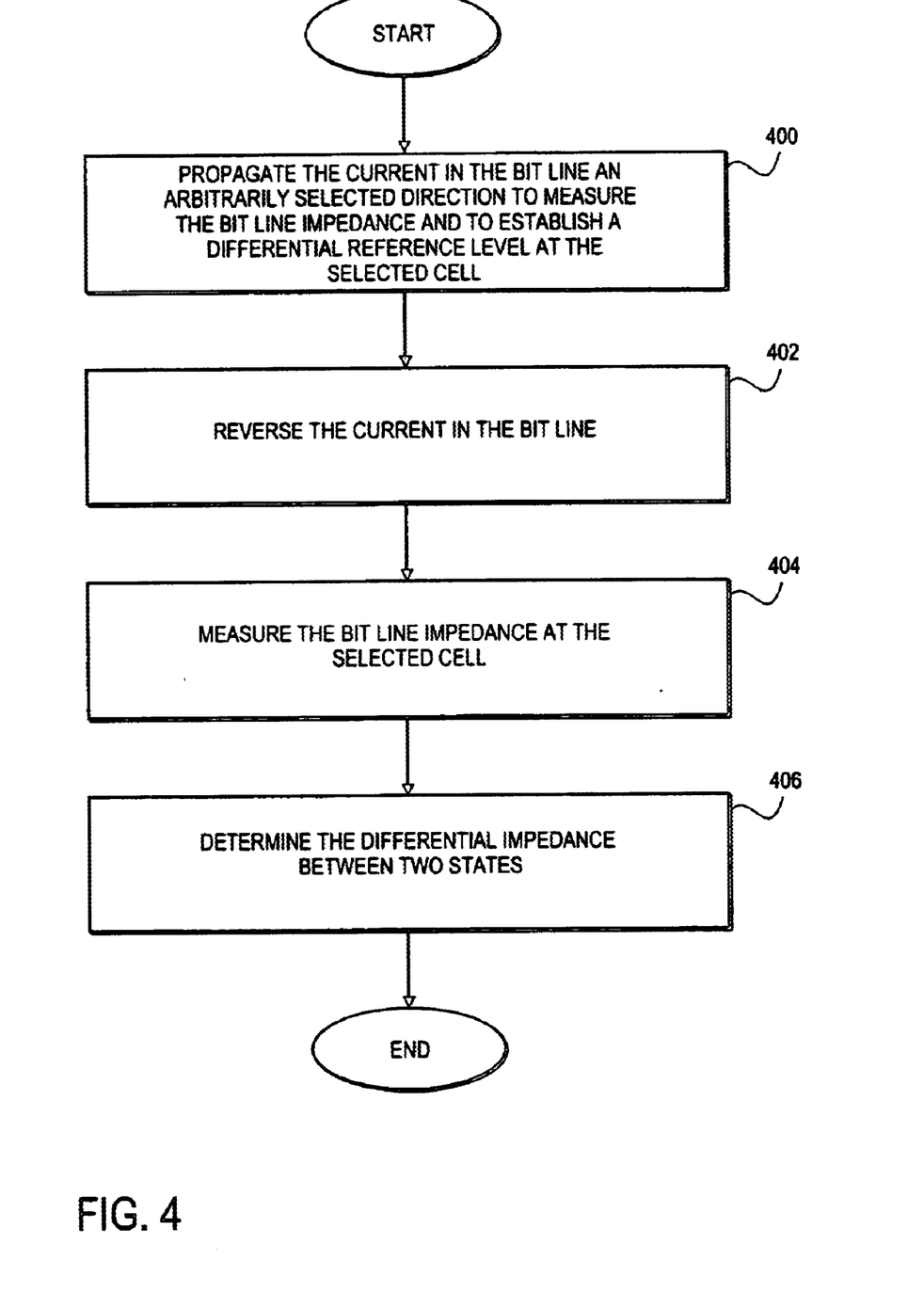
FIG. 4 illustrates a method for mitigating metal migration in the bit-line of the magnetic cell during a read mode according to an embodiment of the present invention.

A method for mitigating metal migration in the bit-line during a read mode is illustrated in FIG. 4 according to an embodiment of the present invention. To mitigate the metal migration, the bit-line current is initially propagated in an arbitrarily selected direction, at 400. This initial bit-line current is used to set the magnetic state of the thin magnetic layer. Moreover, the current enables measurement of the bit-line impedance to establish a differential reference level for reading the impedance of the selected cell. The direction of the bit-line current is then reversed, at 402, to reverse the state of the thin magnetic layer. Only the cell selected by the word-line has the state of the thin magnetic layer change with the sense current. At 404, the bit-line impedance is measured to sense the differential impedance of the selected cell. The differential impedance between the two states is then determined, at 406.

Figure 5:
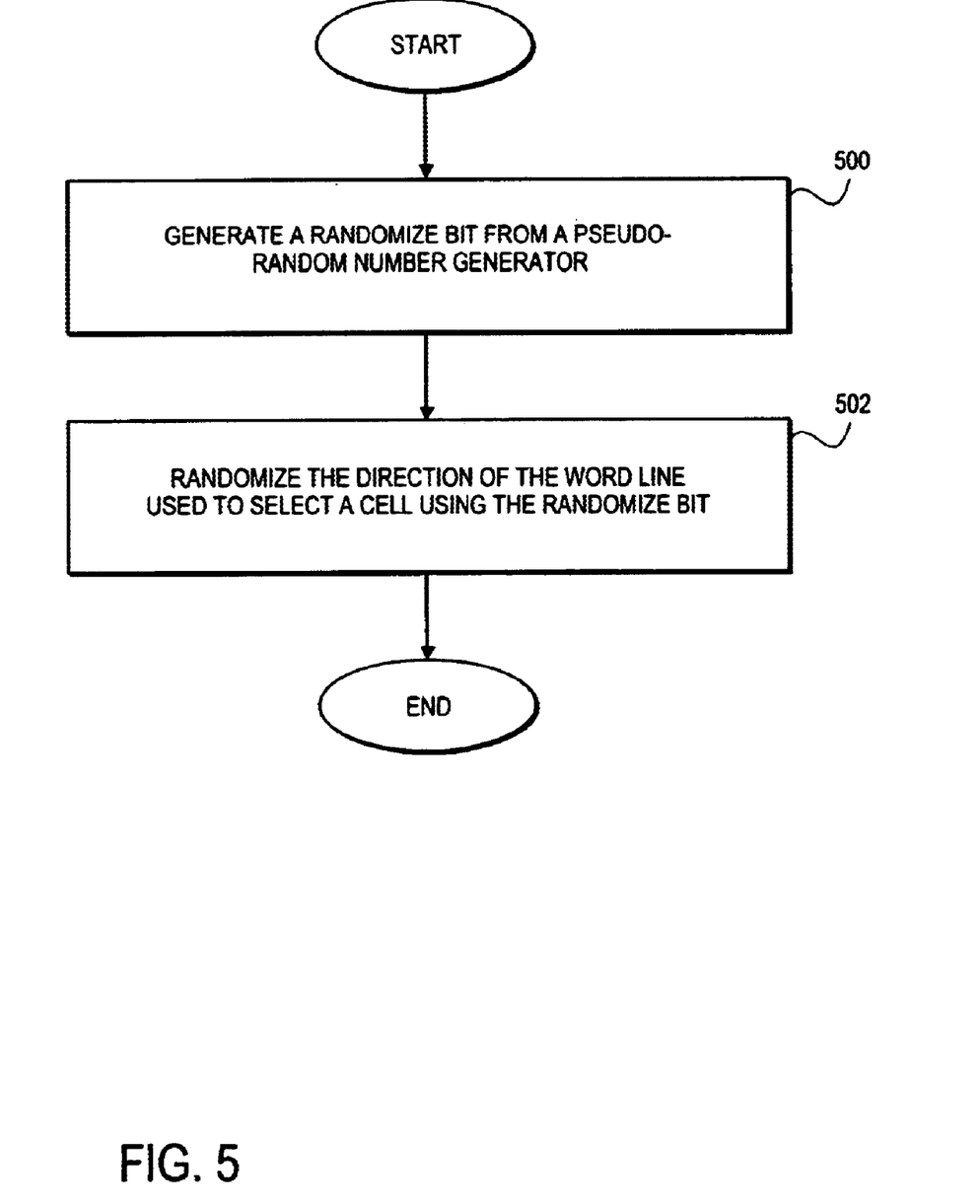
FIG. 5 illustrates a method for mitigating metal migration in the word-lines of the magnetic cell according to an embodiment of the present invention.

A method for mitigating metal migration in the word-lines is illustrated in FIG. 5 according to an embodiment of the present invention. In the present embodiments, a pair of word-lines is used to select a cell. The current directions of the word-line pair are arbitrary but opposite. In some embodiments, the current directions of the word-line pair may be randomized by using a bit from a random number sequence. Thus, the random number bit may be implemented by generating a randomize bit from a pseudo-random number generator, at 500. This randomize bit is then used to randomize the direction of the word-line currents, at 502. In other embodiments, an arbitrary direction of the word-line currents may be selected using any combinational logic that approximates a random number sequence including independently alternating the direction in even and odd addressed word-line selected cells.

Figure 6:
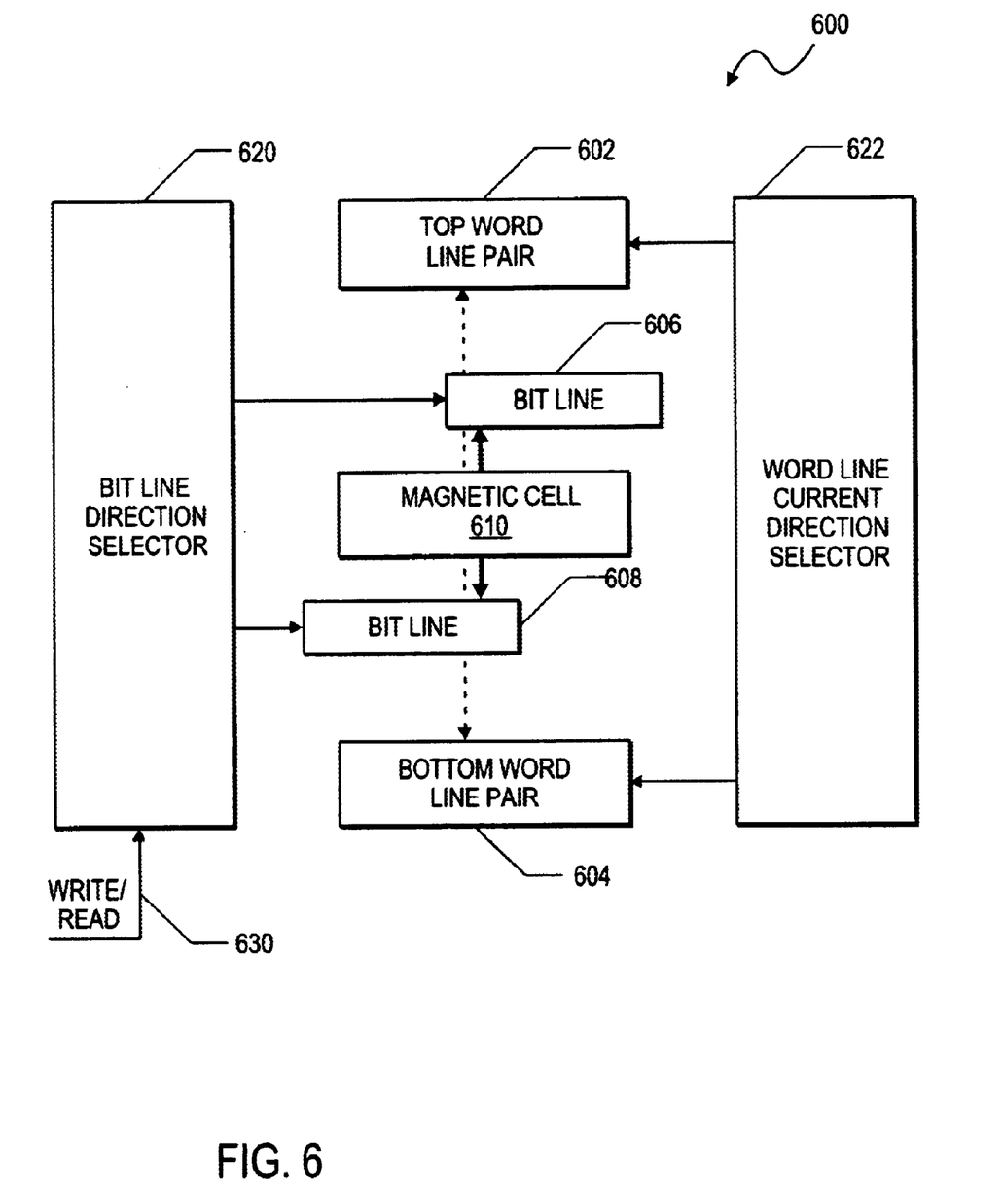
FIG. 6 shows a block diagram of a metal migration mitigation system for an MRAM in accordance with an embodiment of the present invention.

FIG. 6 shows a block diagram of a metal migration mitigation system 600 for an MRAM in accordance with an embodiment of the present invention. The system 600 includes a bit-line current direction selector 620 that selects the direction of the current in the bit-line 606, 608. The selection of the bit-line current direction may be determined by a WRITE/READ input bit 630.

When the WRITE/READ bit 630 indicates that the system is in a write mode, the bit-line current is initially propagated in a direction opposite to the desired magnetic state of the cell 610. The direction of the bit-line current is then reversed to set the desired state of the cell 610 to an appropriate value. When the WRITE/READ bit 630 indicates that the system is in a read mode, the bit-line current is initially propagated in an arbitrarily selected direction. The direction of the bit-line current is then reversed to determine the differential impedance of the selected cell 610.

The metal migration mitigation system 600 also includes a word-line current direction selector 622 that determines the direction of the top 602 and bottom 604 word-line pairs. The word-line current direction selector 622 may include a pseudo-random generator that randomizes the current directions of the word-line pair.

The code related to methods and means for mitigating metal migration in conductors of the magnetic cells described in FIGS. 3 through 6 may be stored on a computer readable medium. In one embodiment, the computer readable medium may be a fixed medium such as read-only (ROM) or a hard disk. In another embodiment, the medium may be a removable medium such a floppy disk or a compact disk (CD). A read/write drive in the computer reads the code on the computer readable medium. The code is then executed in the processor. The processor may access the computer main memory to store or retrieve data.

There has been disclosed herein embodiments for mitigating the migration of metal in the magnetic cells. Providing substantially consistent and statistically symmetrical current flow in the bit-lines and the word-lines surrounding the magnetic cell enables the mitigation of the metal migration.

While specific embodiments of the invention have been illustrated and described, such descriptions have been for purposes of illustration only and not by way of limitation. Accordingly, throughout this detailed description, for the purposes of explanation, numerous specific details were set forth in order to provide a thorough understanding of the present invention. It will be apparent, however, to one skilled in the art that the system and method may be practiced without some of these specific details. For example, although the bit-line and word-line currents are described as being directed in a specific sequence of directions, the currents may be directed to flow in any sequence of directions as long as the currents provide substantially consistent and statistically symmetrical flow. In other instances, well-known structures and functions were not described in elaborate detail in order to avoid obscuring the subject matter of the present invention. Accordingly, the scope and spirit of the invention should be judged in terms of the claims which follow.

What is claimed is:

1. A method, comprising:
    configuring conductors of magnetic cell structures to provide appropriate magnetic fields for writing data to and sensing data from the magnetic cell structures; and
    directing flow of currents to provide substantially consistent and statistically symmetrical current flow in said conductors of the magnetic cell structures, including generating a randomize bit from a random number generator, randomizing directions of currents in at least two pairs of word-line conductors using said randomize bit, to mitigate metal migration in the word-lines,
    said configuring and directing mitigates metal migration in the magnetic cell structures.

2. The method of claim 1, wherein said configuring conductors of the magnetic cell structures includes providing at least two pairs of word-line conductors.

3. The method of claim 1, wherein said providing at least two pairs of work-line conductors includes making the word-line conductors as narrow as possible.

4. The method of claim 1, wherein said at least two pairs of word-line conductors includes a first pair of word-line conductor above the magnetic cell structure and a second pair of word-line conductor below the magnetic cell structure.

5. The method of claim 1, wherein said configuring conductors of the magnetic cell structures includes providing a bit-line that includes a series of vertically meandering lower and upper bit-lines.

6. The method of claim 5, wherein said providing a bit-line includes making the bit-line to be less than about 0.1 $\mu$m thick.

7. The method of claim 5, wherein said providing a bit-line includes making width of the bit-line to be about 2 to 3 times that of a minimum feature size ($\lambda$).

8. The method of claim 5, wherein said directing flow of currents in said conductors of the magnetic cell structures includes:
    propagating a current in the bit-line in a direction opposite to a desired magnetic state of the cell structure, and
    reversing the direction of the current in the bit-line to set the desired state of the cell structure to an appropriate value,
    wherein said propagating and reversing are performed to mitigate metal migration in the bit-line during a write mode.

9. The method of claim 5, wherein said directing flow of currents in said conductors of the magnetic cell structures includes:
    propagating a current in the bit-line in a first direction that is arbitrarily selected,
    reversing direction of the current in the bit-line to a second direction, and
    determining a differential impedance between the currents in said first position and said second position,
    wherein said propagating, reversing, and determining are performed to mitigate metal migration in the bit-line during a read mode.

10. A method, comprising:
    propagating a current in a bit-line in a first direction opposite to a desired magnetic state of the cell structure; and
    reversing the direction of the current in the bit-line toward a second direction to set the desired state of the cell structure to an appropriate value the current in the second direction is higher than the current in the first direction, said propagating and reversing mitigates metal migration in the bit-line during a write mode.

11. The method of claim 10, wherein the current in the second direction is applied for shorter period of time than the current in the first direction, such that the period of time the currents are applied is inversely proportional to the applied currents.

12. A method, comprising:
    propagating a current in a bit-line in a first direction that is arbitrarily selected;
    reversing direction of the current in the bit-line to a second direction, the reversing direction of the current reverses magnetic state of thin magnetic layers in a magnetic cell structure; and
    determining a differential impedance between the currents in said first position and said second position,
    wherein said propagating, reversing, and determining mitigates metal migration in the bit-line during a read mode.

13. The method of claim 12, wherein said current in the bit-line in a first direction enables measurement of bit-line impedance to establish a differential reference level of the magnetic cell structure.

14. A method, comprising:
    generating a randomize bit from a random number generator; and
    randomizing directions of currents in each of said at least two pairs of word-line conductors using said randomize bit,
    wherein said generating and randomizing mitigates metal migration in word-lines.

15. The method of claim 14, wherein said random number generator includes using a pseudo-random generator.

16. The method of claim 14, wherein said random number generator includes a combinational logic element.

17. The method of claim 16, wherein said combinational logic element includes an element that generates said directions of currents as alternating direction in even and odd addresses of the magnetic cell structures.

18. A metal migration mitigation system, comprising:
    a magnetic cell structure including a bit-line and word-lines, said bit-line interweaved on the cell structure, and said word-lines disposed on top and bottom of the cell structure;
    a bit-line current direction selector to select direction of current carried on said bit-line; and a word-line current direction selector to determine direction of currents carried on said word-lines, wherein said bit-line and word-line current direction selectors selects directions of currents to provide substantially consistent and statistically symmetrical current flow in said bit-line and said word-lines.

19. The system of claim 18, further comprising:

a write/read bit to indicate that the magnetic cell structure is in a write mode or a read mode.

20. The system of claim 18, wherein said word-line current direction selector includes a random number generator.

21. A computer readable medium containing executable instructions which, when executed in a processing system, mitigates metal migration in magnetic cell structures, comprising:

configuring conductors of the magnetic cell structures to provide appropriate magnetic fields for writing data to and sensing data from the magnetic cell structures; and directing flow of currents in said conductors of the magnetic cell structures to provides substantially consistent and statistically symmetrical current flow in said conductors, including generating a randomize bit from a random number generator, randomizing directions of currents in at least two pairs of word-line conductors using said randomize bit, to mitigate metal migration in the word-lines.

22. The medium of claim 21, wherein said directing flow of currents in said conductors of the magnetic cell structures includes:

propagating a current in the bit-line in a direction opposite to a desired magnetic state of the cell structure, and reversing the direction of the current in the bit-line to set the desired state of the cell structure to an appropriate value, wherein said propagating and reversing are performed to mitigate metal migration in the bit-line during a write mode.

23. The medium of claim 21, wherein said directing flow of currents in said conductors of the magnetic cell structures includes:

propagating a current in the bit-line in a first direction that is arbitrarily selected, reversing direction of the current in the bit-line to a second direction, and determining a differential impedance between the currents in said first position and said second position, wherein said propagating, reversing, and determining are performed to mitigate metal migration in the bit-line during a read mode.

24. A method comprising:

configuring conductors of magnetic cell structures to provide appropriate magnetic fields for writing data to and sensing data from the magnetic cell structures, including providing at least two pairs of word-line conductors, the at least two pairs of word-line conductors includes a first pair of word-line conductor above the magnetic cell structure and a second pair of word-line conductor below the magnetic cell structure; and directing flow of currents to provide substantially consistent and statistically symmetrical current flow in said conductors of the magnetic cell structures, said configuring and directing mitigates metal migration in the magnetic cell structures.

25. A method comprising:

configuring conductors of magnetic cell structures to provide appropriate magnetic fields for writing data to and sensing data from the magnetic cell structures, including providing a bit-line that includes a series of vertically meandering lower and upper bit-lines; and directing flow of currents to provide substantially consistent and statistically symmetrical current flow in said conductors of the magnetic cell structures, said configuring and directing mitigates metal migration in the magnetic cell structures.

26. The method of claim 25, wherein said directing flow of currents in said conductors of the magnetic cell structures includes:

propagating a current in the bit-line in a direction opposite to a desired magnetic state of the cell structure, and reversing the direction of the current in the bit-line to set the desired state of the cell structure to an appropriate value, wherein said propagating and reversing are performed to mitigate metal migration in the bit-line during a write mode.

27. The method of claim 25, wherein said directing flow of currents in said conductors of the magnetic cell structures includes:

propagating a current in the bit-line in a first direction that is arbitrarily selected, reversing direction of the current in the bit-line to a second direction, and determining a differential impedance between the currents in said first position and said second position, wherein said propagating, reversing, and determining are performed to mitigate metal migration in the bit-line during a read mode.

* * * * *

UNITED STATES PATENT AND TRADEMARK OFFICE
CERTIFICATE OF CORRECTION

PATENT NO.     : 6,693,823 B2
DATED          : February 17, 2004
INVENTOR(S)    : Brown It is certified that error appears in the above-identified patent and that said Letters Patent is hereby corrected as shown below:

<u>Column 5,</u>
Line 36, delete "work-line" and insert -- word-line --.

Signed and Sealed this

Fifteenth Day of June, 2004

JON W. DUDAS
*Acting Director of the United States Patent and Trademark Office*